United States Patent
Kaneda

[19]

[11] Patent Number: 6,134,147
[45] Date of Patent: Oct. 17, 2000

[54] NON-VOLATILE SEMICONDUCTOR MEMORY DEVICE

[75] Inventor: Yoshinobu Kaneda, Osaka, Japan

[73] Assignee: Sanyo Electric Co., Ltd., Moriguchi, Japan

[21] Appl. No.: 09/252,680

[22] Filed: Feb. 22, 1999

[30] Foreign Application Priority Data

Feb. 24, 1998 [JP] Japan ................................. 10-042379
Mar. 10, 1998 [JP] Japan ................................. 10-058358
Mar. 10, 1998 [JP] Japan ................................. 10-058359
Jan. 11, 1999 [JP] Japan ................................. 11-004359

[51] Int. Cl.$^7$ ..................................................... G11C 16/01

[52] U.S. Cl. ................................. 365/185.25; 365/185.21

[58] Field of Search ............................... 365/185.25, 149, 365/233, 185.2, 204, 185.21

[56] References Cited

U.S. PATENT DOCUMENTS 5,880,988   3/1999   Bertin et al. ........................ 365/185.25
5,929,658   7/1999   Cheung et al. ........................... 327/53

*Primary Examiner*—David Nelms
*Assistant Examiner*—David Lam
*Attorney, Agent, or Firm*—Armstrong, Westerman, Hattori, McLeland & Naughton

[57] ABSTRACT

A semiconductor memory device comprises: memory cells 1 and 2 in which data are stored; capacitor 23 which are connected to the output line 10 of the memory cells 1 and 2 and are discharged according to a sense; and a sense circuit 25 which supplies a discharge current to the said non-volatile memory cell caused by discharge of said capacitor 23 and senses a change of the output voltage of said output line, which is generated according to a data stored in said non-volatile memory (cf. FIG. 1).

12 Claims, 7 Drawing Sheets

Fig.4

|  | WRITE MODE | ERASE MODE | READ MODE | STAND-BY MODE |
|---|---|---|---|---|
| WORD-LINE WLm (CONTROL GATE CG) | 2V | 12-15V | 4V | 0V |
| BIT LINE BLm (DRAIN D) | 0V | 0V | 2V | 0V |
| COMMON SOURCE LINE SL (SOURCE S) | 9V | 0V | 0V | 0V |
| SUBSTRATE 102 | 0V | 0V | 0V | 0V |

NON-VOLATILE SEMICONDUCTOR MEMORY DEVICE

BACKGROUND OF THE INVENTION

1. Field of the Invention

This invention relates to non-volatile semiconductor memory device, and more particularly to a semiconductor memory device in which a method of application of signals to a sense amplifier is able to read data from memory cells such as flash memories at high speed.

2. Discussion of the Related Art

Recently, attention has been paid to non-volatile semiconductor memories such as mask ROMs, PROMs (Programmable ROM), EPROMs(Erasable and Programmable Read Only Memories) and EEPROMs (Electrical Erasable and Programmable Read Only Memories) in ROMs(Read Only Memory) as a kind of LSI Memory. In the EPROM or the EEPROM, charges are stored in the floating gate and the variation of the threshold voltage due to the presence or absence of charges is detected with the control gate to read and write the data. An example of the EEPROM is a flash EEPROM(flash memory), in which the data of the whole memory chip are erased, or the memory cell array is divided into an optional number of blocks, and in each of the blocks the data are erased.

Memory cells forming the flash EEPROM are roughly divided into split gate type ones and stack gate type ones.

The split gate type flash EEPROM is disclosed by "WO92/18980 (G11C 13/00)".

FIG. 2 is a sectional view of the split gate type flash EEPROM disclosed by "WO92/18980".

As shown in FIG. 2, an N-type source S and an N-type drain D are formed on a P-type single crystal silicon substrate. On a channel CH between the source S and the drain D, a floating gate FG is formed through a first insulating film 103. On the floating gate FG, a control gate CG is formed through a second insulation film 104. A part of the control gate CG is formed through a first insulating film 103 on a channel CH, thus forming a selecting gate 105.

The arrangement of the above-described flash memory is as shown in FIG. 7.

In FIG. 7, a common word line 3 is coupled to nonvolatile flash memory cells 1 and 2, and bit lines 4 and 5 are independently connected. The bit lines 4 and 5 . . . are combined together by I/O line 10. And a predetermined pre-charge voltage is applied to the bit lines 4 and 5 . . . through a N channel MOS transistor 18. One end of the N channel MOS transistor is connected to the source voltage ($V_{DD}$), and other end of that is connected to I/O line 10. The bit lines 4 and 5 have N-channel MOS transistors 8 and 9 which are driven by column lines 6 and 7 . . . , respectively.

The bit lines 4 and 5 are combined together by I/O line 10, and connected to a sense amplifier 11 using a current mirror circuit. When an N-channel MOS transistor 12 is turned on in response to a sense signal (read-out signal), the sense amplifier 11 is activated.

It is assumed that it is the sense time, and the column line 6 is selected, and the N-channel MOS transistor 8 is turned on and the memory cell 1 is in "on" state. The N-channel MOS transistor 12 is turned on by the sense signal, and the sense amplifier 11 operates, and a P-channel MOS transistor 14 which applies a bias current to the memory cell is turned on, so that current flows in the memory cell 1. As a result, the voltage of the I/O line 10 is decreased towards the ground level. When the voltage of the I/O line 10 is decreased, the transistor 15 tends to be "off" and the transistor 14 also tends to be "off". As a result, the transistor 15 is turned off, and the transistor 16 is tuned on.

Accordingly, an amplified "L" level signal is provided at an output terminal 17.

In the case where the memory cell 1 is in "off" state (programmable state), the same operation occurs in inverse polarity, so that an amplified "H" level signal is provided at the output terminal 17.

Hence, according to the circuit of FIG. 7, the flash memory data can be amplified while being read out.

However, the circuit of FIG. 7 suffers from the problem that it takes time to read out data. That is, in the circuit of FIG. 7, in order to obtain a signal level necessary for inverting the differential amplifier forming the sense amplifier 11, it is necessary to flow a predetermined amount of current to the memory cell, taking a predetermined period of time. This predetermined period of time cannot be controlled by the designer, and of all the cells, the longest time one is the standard value of the product, and therefore the time is unstable and slow.

SUMMARY OF THE INVENTION

Accordingly, an object of the invention is to solve the above-described problems.

The foregoing object of the invention has been achieved by the provision of a semiconductor memory device which comprises: memory cells 1,2 . . . in which data are stored; capacitor 23 which are connected to the output line 10 of said memory cell, and a sense circuit (latch circuit 25)which senses the output voltages of said output line.

Namely the semiconductor memory device comprises: a non-volatile memory cell in which data are stored; a capacitor which is connected to the output line of said non-volatile memory cell and is discharged according to a sense signal; a sense circuit which supplies a discharge current to the said non-volatile memory cell caused by discharge of said capacitor and senses a change of the output voltage of said output line, which is generated according to a data stored in said non-volatile memory; and a charging circuit charging said capacitor.

And another aspect of the present invention is a semiconductor memory device which comprises: a memory cell in which data are stored; a first capacitor which is connected to the output line of said memory cell and is discharged according to a first sense signal; a second capacitor which is connected to the output line of said memory cell, and is discharged according to a second sense signal; a control circuit transmitting the first or second sense signal to said first and second capacitors so that said first and second capacitor are activated to discharge alternately; a sense circuit which supplies a discharge current to the said non-volatile memory cell caused by discharge of said first or second capacitor and senses a change of the output voltage of said output line, which is generated according to a data stored in said non-volatile memory cell; and charging circuit for charging said first and second capacitors.

The nature, utility and principle of the invention will be more clearly understood from the following detailed description and the appended claims when read in conjunction with the accompanying drawings

BRIEF DESCRIPTION OF THE DRAWINGS

In the accompanying drawings:

FIG. 4 is a block diagram showing peripheral devices of the semiconductor memory device according to the invention;

DESCRIPTION OF THE PREFERRED EMBODIMENT

The semiconductor memory device of the invention will be described with reference to a non-volatile semiconductor memory device shown in FIG. 1.

Figure 1:
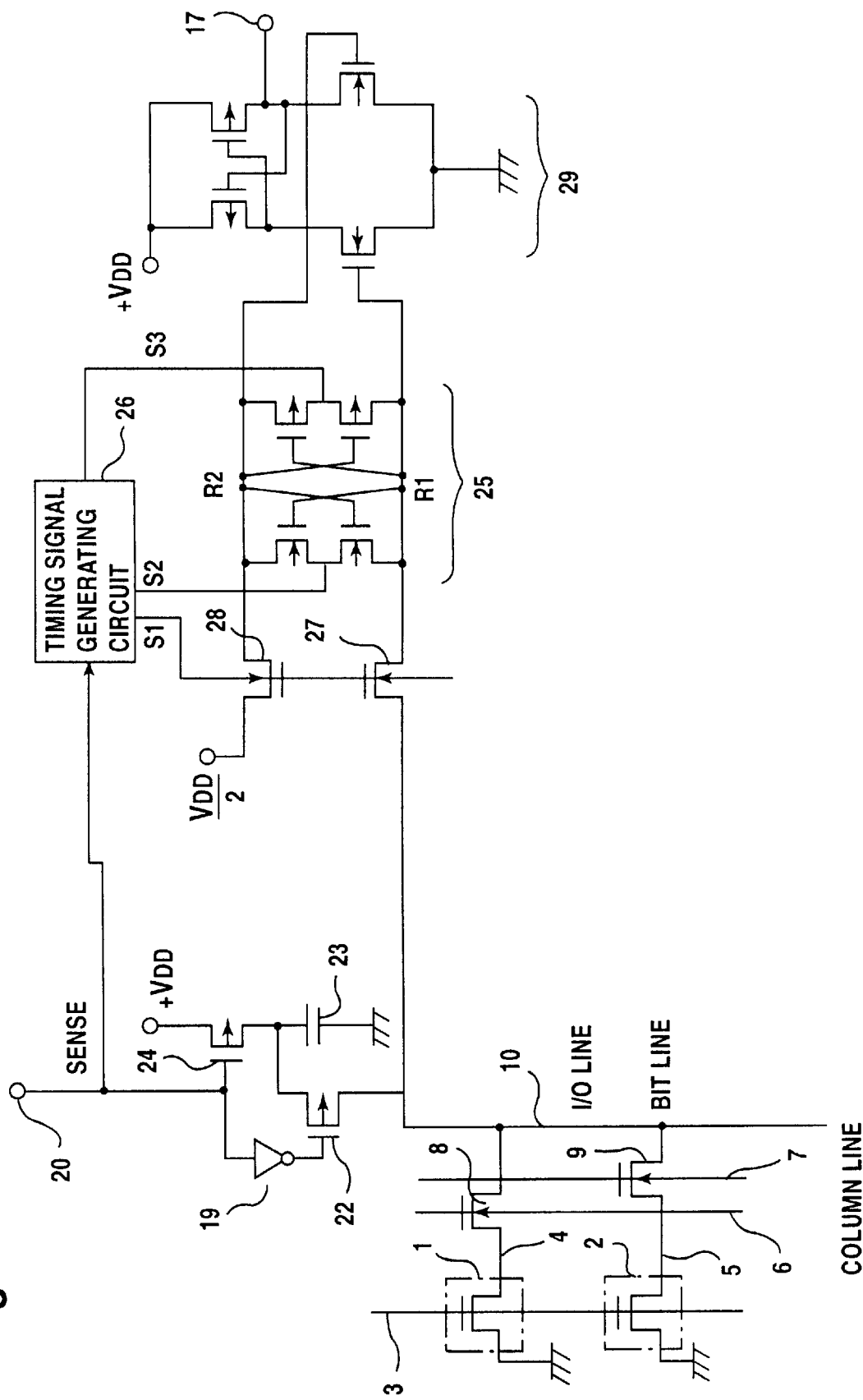
FIG. 1 is a circuit diagram, partly as a block diagram, showing the arrangement of a semiconductor memory device according to the first embodiment of the invention.
Figure 2:
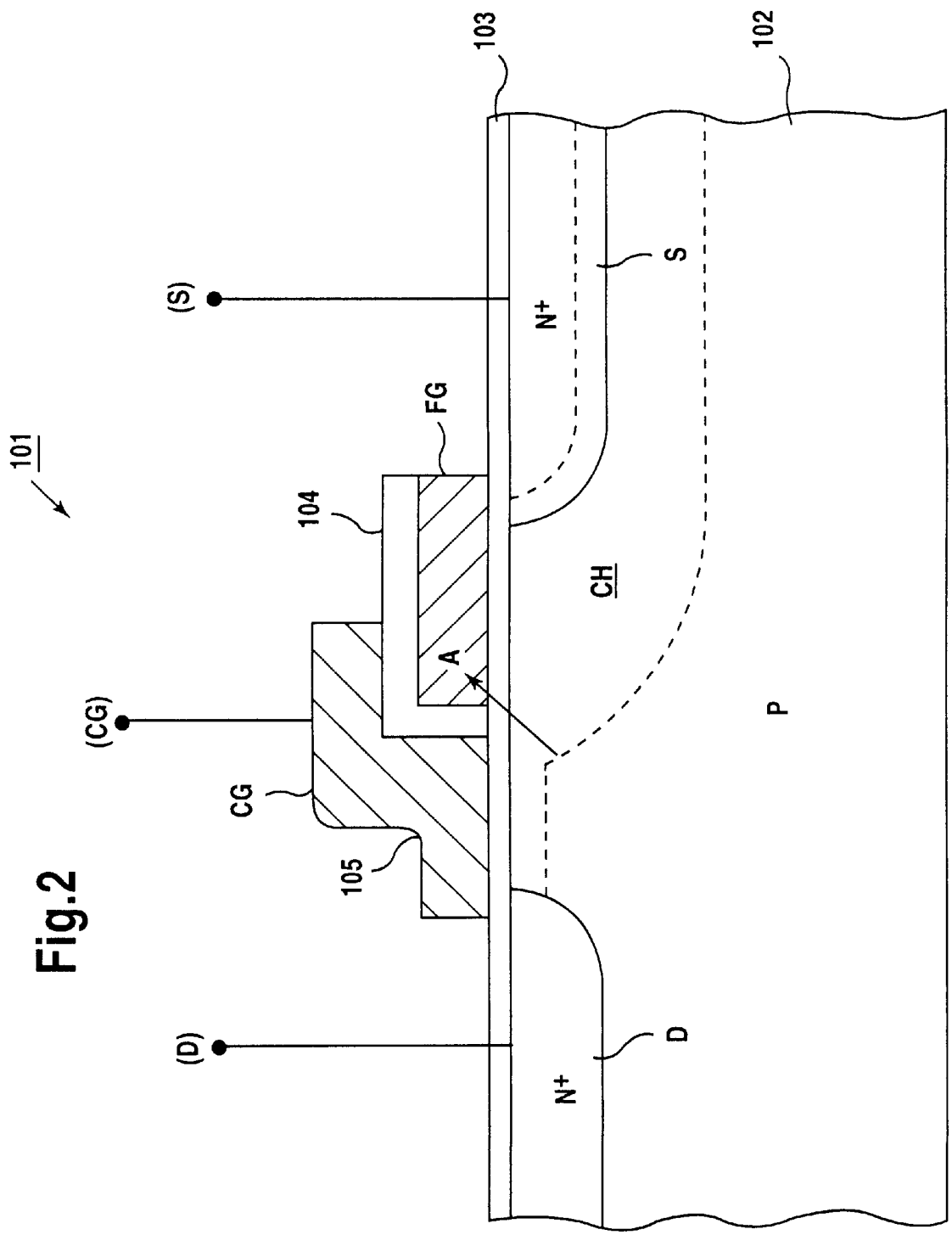
FIG. 2 is a sectional view of a split-gate type memory cell.

In FIG. 1, reference numeral 20 designates a terminal to which a sense signal is applied to read nonvolatile flash memory cells 1,2; 22, a P-channel MOS transistor which, in response to the sense signal, applies charges to an I/O line 10 which has been charged in a capacitor 23 in advance; 24, a P-channel MOS transistor which is turned on to charge the capacitor 23 during a period of time absent from the sense signal. The sense signal is applied to the gate of the P-channel MOS transistor 22 through an inverter 19.

25, a latch circuit which senses and latches a signal read out of the I/O line 10; 26, a timing signal generating circuit which generates signals S1, S2 and S3 in response to the timing of application of the sense signal; 27, an N-channel MOS transistor which controls the connection and disconnection of the I/O line 10 and the latch circuit 25 in response to a signal S1; 28, an N-channel MOS transistor which controls the connection and disconnection of a reference voltage (for example, VDD/2) and the latch circuit 25 in response to the signal S1; and 29, a buffer.

Figure 7:
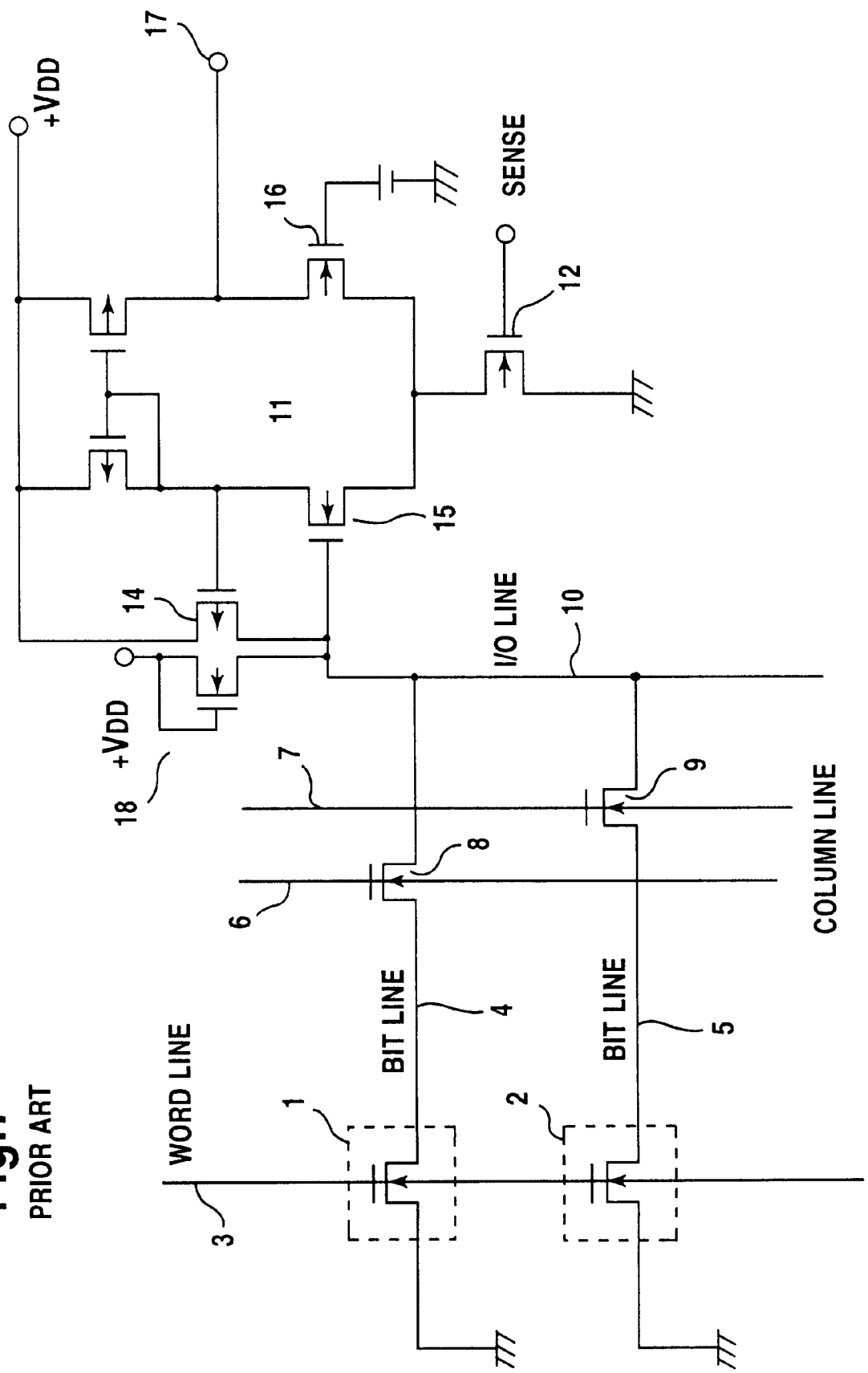
FIG. 7 is a circuit diagram showing an example of a conventional semiconductor memory device.

In FIG. 1, parts corresponding functionally to those already described with reference to FIG. 7 are therefore designated by the same reference numerals or characters.

First, the fundamental operation of the nonvolatile flash memory cell of FIG. 1 will be described later.

Figure 3:
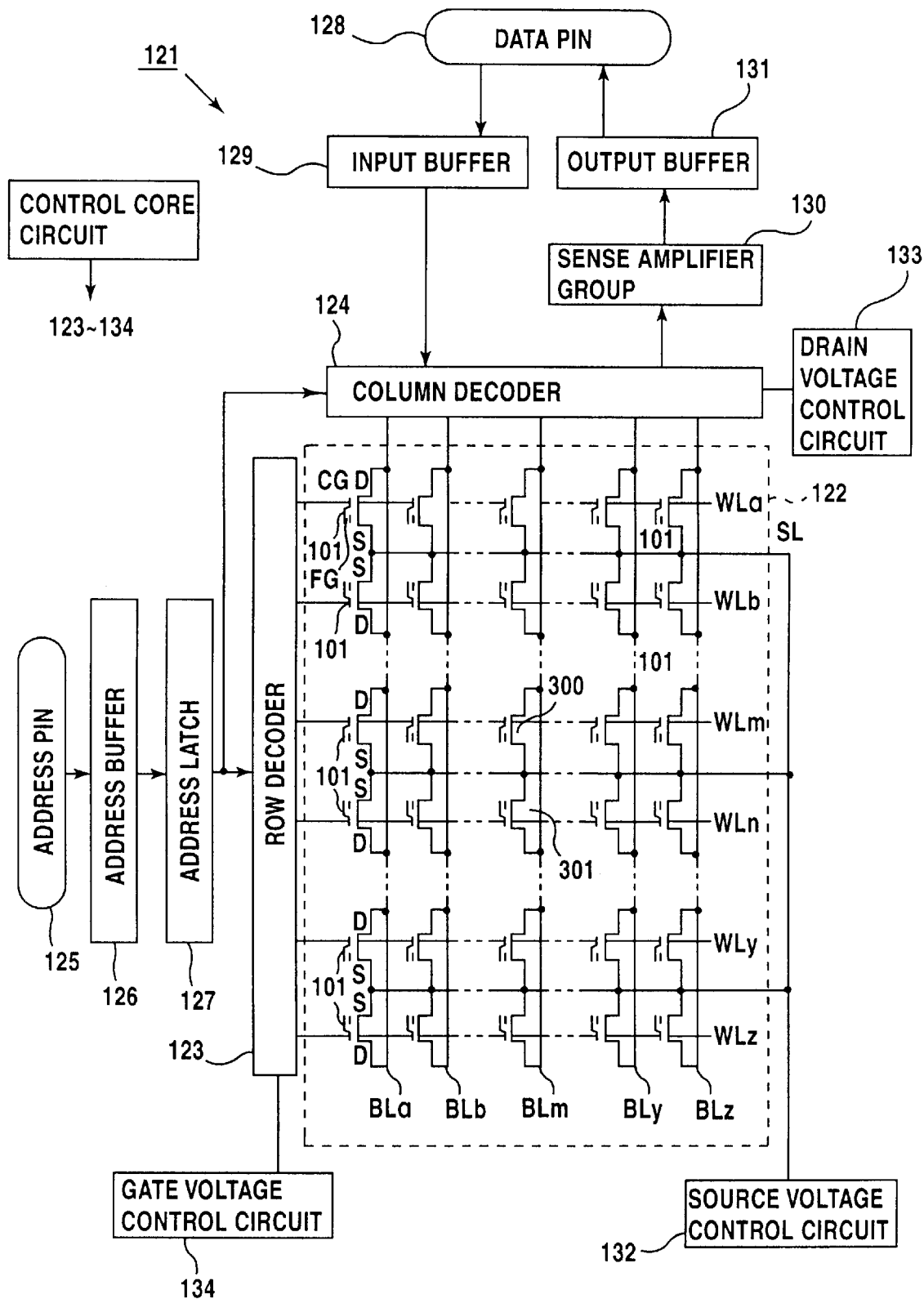
FIG. 3 is a diagram for a description of the operation of the semiconductor memory device of the invention.

FIG. 3 shows the whole arrangement of a flash EEPROM 121 using a split gate type memory cell 101.

A memory cell array 122 is made up of a plurality of memory cells 101 arranged in matrix form. The control gates CG of the memory cells 101 arranged in the direction of row are connected to common word lines WLa through WLz. The drains of the memory cells 101 arranged in the direction of column are connected to common bit lines BLa through Blz. The sources S of all the memory cells 101 are connected to a common source line SL.

The word lines WLa through WLz are connected to a row decoder 123, and the bit lines BLa through Blz are connected to a column decoder 124.

A row address (data signal) and a column address (data signal) applied from outside are applied to an address pin 125. The row address and the column address are further applied through an address buffer 126 to an address latch 127. Of the addresses latched by the address latch 127, the row address is transferred to the row decoder 123, and the column address is transferred to the column decoder 124.

The row decoder 123 selects one out of the word lines WLa through WLz which corresponds to the row address latched by the address latch 127, and connects the word line thus selected to a gate voltage control circuit 134.

The column decoder 124 selects one out of the bit lines BLa through BLz which corresponds to the column address latched by the address latch 127, and connects the bit line thus selected to a drain voltage control circuit 133.

The gate voltage control circuit 134 controls the potential of the word line connected through the row decoder 123 thereto in accordance with operation modes shown in FIG. 4. The drain voltage control circuit 133 control the potential of the bit line connected through the column decoder 124 thereto in accordance with the operation modes shown in FIG. 4.

The common source line SL is connected to the source voltage control circuit 132. The source voltage control circuit 132 controls the potential of the common source line SL in accordance with the operation modes shown in FIG. 4.

Data externally specified is applied to a data pin 128. The data is supplied through an input buffer 129 to the column decoder 124. The column decoder 124 controls the potential of the bit line selected as was described above in response to the data.

Data read from an optional memory cell 101 is applied from the bit lines BLa through BLz through the column decoder 124 to a sense amplifier group 130. The sense amplifier group 130 is made up of several sense amplifiers (not shown). The column decoder 124 connects a selected bit line to the sense amplifiers.

Data discriminated by the sense amplifier group 130 is supplied from an output buffer 131 through the data pin 128 outside.

The operations of the above-described circuits (123 through 134) are controlled by a control core circuit 140.

Figure 5:
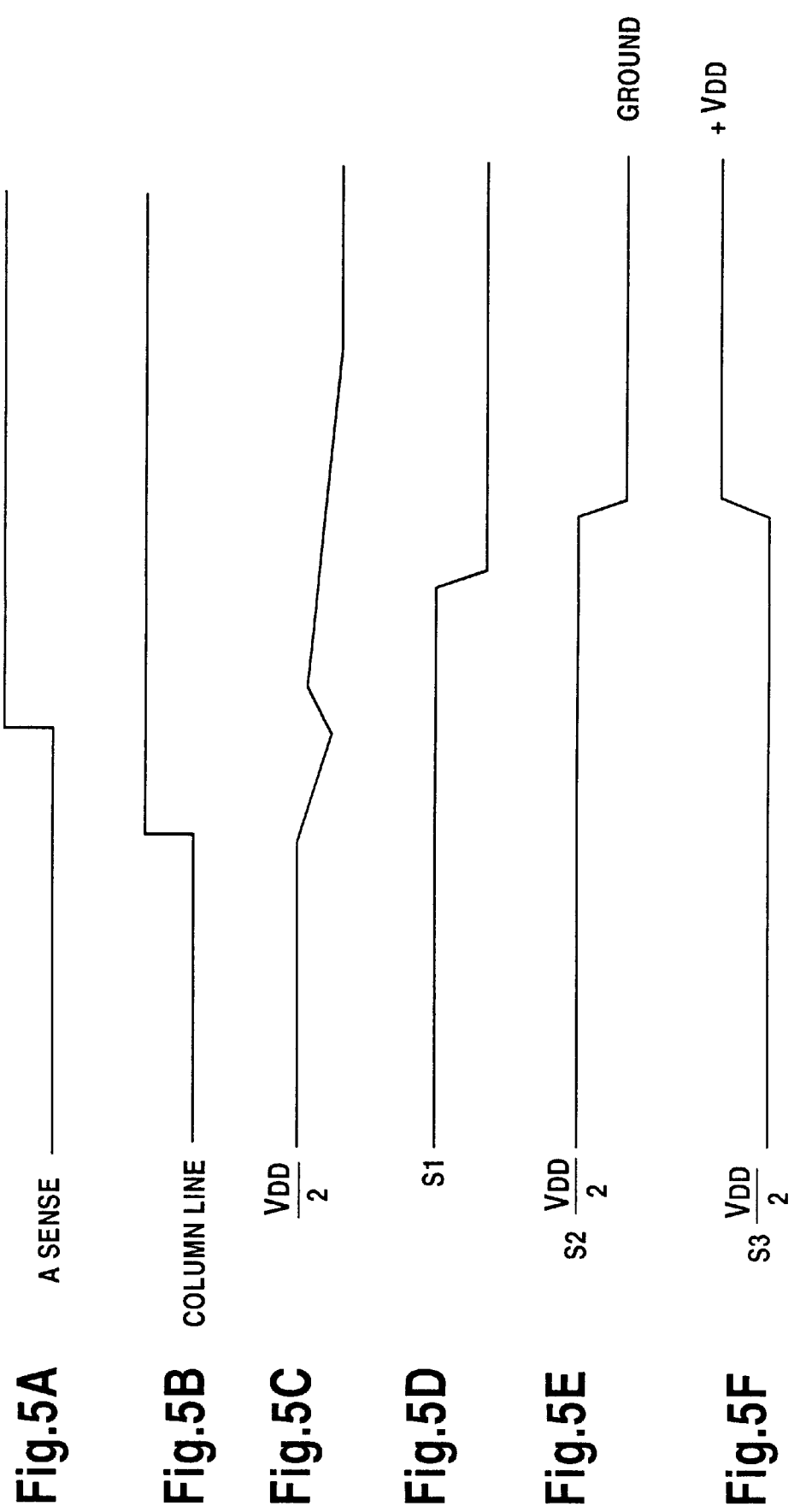
FIGS. 5A–F is a waveform diagram for a description of the operation of the circuit shown in FIG. 1.

Data are read from the memory cells 1 and 2 in FIG. 1 by the peripheral device as shown in FIG. 3. The operation of the circuit of FIG. 1 will be described with reference to FIGS. 5A–5F. Before the generation of an "H" level signal applied to column line 6 as shown in FIG. 5B, the voltage of the I/O line 10 is precharged to +VDD/2 as shown in FIG. 5C. The signal S1 in FIG. 5D is at "H" level, and the transistors 27 and 28 are kept turned on.

In this case, the sense signal is applied to the terminal 20.

When the "L" level sense signal 1 (FIG. 5A) is applied to the transistors 22 and 24, the transistor 24 is turned on. Therefore, the capacitor 23 is charged to the source voltage (+VDD).

On the other hand, as shown in FIGS. 5E,5F, the signals S2 and S3 generate voltage +VDD/2. And in the latch circuit 25, all the nodes are all at +VDD/2, and therefore the latch circuit 25 is inoperable.

Under this condition, as shown in FIG. 5B, the signal of the column line 6 rises. If the memory cell 1 is in "on" state(erased state), then current flows in the bit line 4, and the voltage of the I/O line 10 is temporarily decreased as shown in FIG. 5C.

Immediately after the rise of the signal of the column line 6, the sense signal of FIG. 5A rises. When the sense signal rises, the transistor 22 is turned on while the transistor 24 is turned off. As above described, the predetermined voltage charged in the capacitor 23 in the period absent from applied signal to the I/O line 10. Therefore, the voltage of the I/O line 10 is momentarily increased as shown in FIG. 5C;

however, it is decreased being discharged by the memory cell 1. And when it is estimated that the voltage of the I/O line 10 is decreased to a value with which the latch circuit 25 (having a sensing function) operates, the "L" level signal S1 is applied to the transistors 27 and 28. As a result, the transistors 27 and 28 turn off and the I/O line 10 is interrupted from the latch circuit 25.

On the other hand, as shown in FIGS. 5E, 5F, the signals S2 and S3 are maintained at the voltage +VDD/2 during the period of time other than the sensing time. After the fall of the signal S1 shown in the FIG. 5D, the signal S2 has the ground level as shown in FIG. 5E, while the signal S3 has the supply voltage +VDD level as shown in FIG. 5F. Even when the transistors 27 and 28 are turned off, the data of the I/O line 10 remains in the input line R1. The timing of the fall of the signal S1 shown in FIG. 5D is so set that it occurs when the voltage of the I/O line 10 decreases lower than the voltage +VDD/2 so that the level difference is obtained to invert the latch circuit 25. Hence, the latch circuit 25 becomes operable for the first time, and performs positive feedback operation, and the input line R1 of the latch circuit 25 is latched at "L" level, while the input line R2 is latched at "H" level. In this case, the transistor 27 is kept off, and therefore it is unnecessary for the latch circuit 25 to drive the capacitive load provided on the left side of the transistor 27; that is, the latch circuit 25 can invert quickly.

In the invention, the capacitor 23 is discharged by the data obtained from the memory cell 1 to transmit the read signal, and therefore the signal is transmitted quickly. Furthermore, in the invention, the designer can set the timing of generation of the signals S1 through S3 with the timing signal generating circuit 26 and with a delay circuit using an inverter etc. Hence, the timing of read can be freely set, and the period of time required for reading can be reduced.

Therefore, the read signal from the memory cell 1 can be taken out of the latch circuit 25 at high speed.

The output signal of the latch circuit 25 is applied to the buffer 29, and an "L" level output signal is provided at the output terminal 17.

When, in the case where the memory cell 1 is off, the transistor 22 is turned on, then the voltage of the I/O line 10 has the supply voltage more than +VDD level by the charge of the capacitor 23. And, this high level signal is latched by the latch circuit 25, and similarly as in the above-described case, an "H" level signal is obtained at the output terminal 17.

Figure 6:
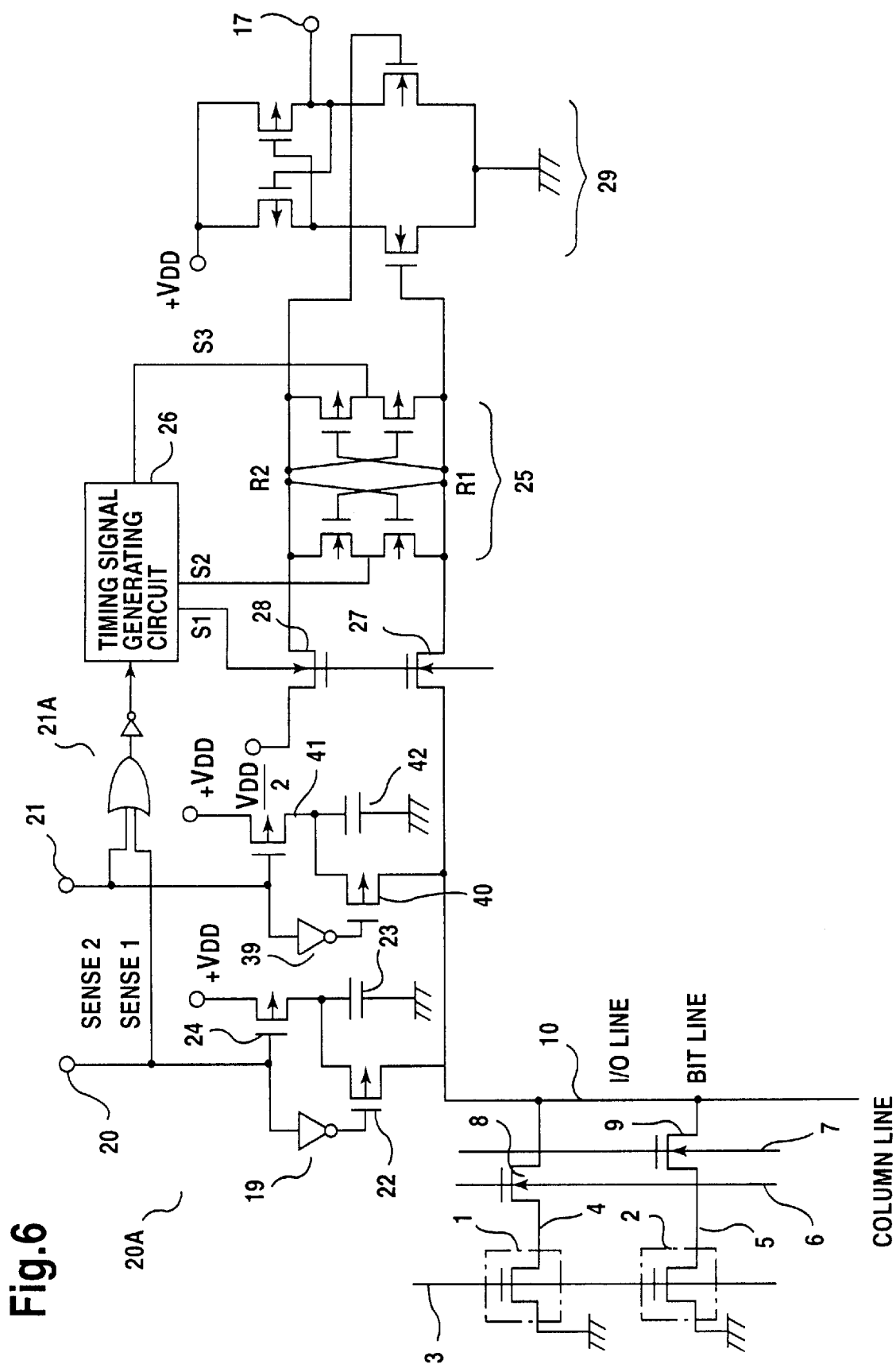
FIG. 6 is a circuit diagram, partly as a block diagram, showing the arrangement of a semiconductor memory device according to the second embodiment of the invention.

Next, the second embodiment of the present invention is described, referring to FIG. 6. The difference point between the second embodiment and the first embodiment as above described, is that a plurality of the charge/discharge circuits (in this embodiment, another charge/discharge circuit 21A is added to the charge/discharge circuit 20A) are provided with and they are driven alternately.

In FIG. 6, a terminal 21 to which a sense signal 2 is applied to read nonvolatile flash memory cells 1,2 . . . , is added to the terminal 20 to which a sense signal 1 is applied to read nonvolatile flash memory cells 1,2 . . . . Further charge/discharge circuit 21A is constituted by an inverter 39, P-channel MOS transistor 40, capacitor 42, P-channel MOS transistor 41, corresponding to the inverter 19, P-channel MOS transistor 22, capacitor 23, P-channel MOS transistor 24 of the charge/discharge circuit 20A, respectively.

Now, the reason why the sense signal from the sense terminals 20,21 is divided into the sense signal 1 and the sense signal 2 every sense signal arrival, will be described. This is provided in order to prevent the difficulty that, in the case where the sense signal arrives continuously, the capacitor 23 is not sufficiently charged. During the period of time that the transistor 22 is turned on, performing the sense operation(voltage charged in the capacitor 23 is discharged and applied to the I/O line 10), the transistor 40 is turned off while the transistor 41 is turned on, to charge the capacitor 42. As a result, upon arrival of the next sense signal, the capacitor 23 is not used, and instead the capacitor 42 thus charged is used. Therefore, even if the sense signal is short in period, the reading operation can be achieved.

When the capacitor 42 is used, the "L" level signal is kept applied to the terminal 20, and the capacitor 23 is kept charged. The sense signal 2 is applied to the terminal 21 which changes from "L" level to "H" level as shown in FIG. 5A.

In the nonvolatile flash memory device of the present invention, since each of the capacitances of the capacitor 23,42 is determined at the values according to the process conditions, the areas occupied in the cell size are different from each other. In the case in account to the area ratio, for example in the nonvolatile flash memory cell, area occupied in the cell size is reduced by dividing the I/O lines 10 by 128 bit lines with respect to 2048 bit lines. The nonvolatile flash memory device is applicable not only to split gate typed flash memory device (containing EEPROMs) but also stacked gate typed flash memory device, and other nonvolatile flash memory devices such as mask ROMs, PROMs (Programmable ROM), EPROMs.

In the semiconductor memory device of the invention, the charge stored in the period other than sensing period in the capacitors and at the beginning of the sensing time, the capacitors are discharged in response to the data from the memory cell to transmit the read signal, and therefore the reading operation is achieved quickly.

Furthermore, in the semiconductor memory device of the invention, a plurality of capacitors are provided which are connected to the output line of the memory cell and are discharged according to the data stored in the memory cell, and are used successively. Therefore, the reading operation can be achieved at high speed.

Furthermore, in the semiconductor memory device of the invention, by controlling the timing generating the signal S1 to S3 by the delay circuit using an inverter etc., in the timing signal generating circuit, reading timing can be determined easily by the planner.

While there has been described in connection with the preferred embodiment of the invention, it will be obvious to those skilled in the art that various changes and modifications may be made therein without departing from the invention, and it is aimed, therefore, to cover in the appended claims all such changes and modifications as fall within the true spirit and scope of the invention.

What is claimed is:

1. A semiconductor memory device comprising:
    a non-volatile memory cell in which data are stored;
    a capacitor which is connected to the output line of said non-volatile memory cell and is discharged according to a sense signal;
    a sense circuit which supplies a discharge current to said non-volatile memory cell caused by discharge of said capacitor and senses a change of the output voltage of said output line, which is generated according to a data stored in said non-volatile memory cell; and
    a charging circuit charging said capacitor.
2. The semiconductor memory device according to claim 1, wherein said capacitor is charged prior to sensing of said memory cell by said sense circuit.

3. The semiconductor memory device according to claim 2, further comprising a switch disposed between one end of the capacitor and the output line.

4. The semiconductor memory device according to claim 1, further comprising a timing signal generating circuit controlling the sense circuit by generating a timing signal based on the sense signal.

5. The semiconductor memory device according to claim 1, wherein the capacitor is connected to a source voltage.

6. The semiconductor memory device according to claim 1, wherein the output line is provided a reference voltage which is half of a source voltage charging the capacitor.

7. The semiconductor memory device according to claim 1, wherein all circuit elements comprising the non volatile memory cells, said capacitors, and output lines, are integrated in a semiconductor substrate.

8. A semiconductor memory device comprising:

a memory cell in which data are stored;

a first capacitor which is connected to the output line of said memory cell and is discharged according to a first sense signal;

a second capacitor which is connected to the output line of said memory cell, and is discharged according to a second sense signal;

a control circuit transmitting the first or second sense signal to said first and second capacitors so that said first and second capacitor are activated to discharge alternately;

a sense circuit which supplies a discharge current to the said non-volatile memory cell caused by discharge of said first or second capacitor and senses a change of the output voltage of said output line, which is generated according to a data stored in said non-volatile memory cell; and charging circuit for charging said first and second capacitors.

9. The semiconductor memory device according to claim 8, further comprising a timing signal generating circuit controlling the sense circuit by generating a timing signal based on the sense signals.

10. The semiconductor memory device according to claim 8, wherein said first and second capacitors are charged prior to sensing of said memory cell by the sense circuit.

11. The semiconductor memory device according to claim 8, further comprising a switch disposed between one end of the capacitors and the output line.

12. The semiconductor memory device according to claim 8, further comprising a timing signal generating circuit controlling the sense signal of the nonvolatile memory cell, wherein each of the sense circuit and a switch is driven according to the timing signal from said timing signal generating circuit.

* * * * *